(12) United States Patent
Lee et al.

(10) Patent No.: US 8,184,449 B2
(45) Date of Patent: May 22, 2012

(54) ELECTRONIC DEVICE HAVING STACK-TYPE SEMICONDUCTOR PACKAGE AND METHOD OF FORMING THE SAME

(75) Inventors: Jung-Do Lee, Uiwang-si (KR); Hak-Kyoon Byun, Asan-si (KR); Tae-Hun Kim, Cheonan-si (KR); Sang-Uk Han, Hwaseong-si (KR); Seon-Hyang You, Daejeon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 850 days.

(21) Appl. No.: 12/206,355

(22) Filed: Sep. 8, 2008

(65) Prior Publication Data

US 2009/0067143 A1    Mar. 12, 2009

(30) Foreign Application Priority Data

Sep. 7, 2007  (KR) .................. 10-2007-0091099

(51) Int. Cl.
*H05K 7/10*    (2006.01)
*H05K 7/12*    (2006.01)

(52) U.S. Cl. ......... 361/771; 257/686; 257/685; 361/735

(58) Field of Classification Search .................. 361/771, 361/735; 257/686, 685
See application file for complete search history.

(56) References Cited

U.S. PATENT DOCUMENTS

| | | | | |
|---|---|---|---|---|
| 6,051,878 | A * | 4/2000 | Akram et al. | 257/686 |
| 7,915,718 | B2 * | 3/2011 | Lee et al. | 257/668 |
| 2005/0090050 | A1 | 4/2005 | Shim et al. | |
| 2006/0065972 | A1 * | 3/2006 | Khan et al. | 257/712 |
| 2006/0220256 | A1 | 10/2006 | Shim et al. | |

FOREIGN PATENT DOCUMENTS

KR    1020050019665    3/2005

* cited by examiner

*Primary Examiner* — Yuriy Semenenko
*Assistant Examiner* — Andargie M Aychillhum
(74) *Attorney, Agent, or Firm* — F. Chau & Associates, LLC

(57) ABSTRACT

An electronic device includes a lower electronic part including a lower substrate, a lower chip structure disposed on the lower substrate, and a lower molding layer covering the lower chip structure and having a recessed region in an upper surface of the lower molding layer, and an upper electronic part including an upper substrate disposed on the lower electronic part, and an upper chip structure projecting from the upper substrate, wherein the recessed region of the lower molding layer receives the upper chip structure.

20 Claims, 10 Drawing Sheets

ELECTRONIC DEVICE HAVING STACK-TYPE SEMICONDUCTOR PACKAGE AND METHOD OF FORMING THE SAME

CROSS-REFERENCE TO RELATED APPLICATION

This application claims priority to Korean Patent Application No. 10-2007-0091099, filed on Sep. 7, 2007, the contents of which are incorporated herein by reference in their entirety.

BACKGROUND OF THE INVENTION

1. Technical Field

The present disclosure relates to an electronic device and a method of forming the same, and more particularly, to an electronic device having a stack-type semiconductor package and a method of forming the same.

2. Discussion of the Related Art

A multi-chip package such as a stack-type semiconductor package includes a plurality of semiconductor chips. The stack-type semiconductor package stacks various devices such as, for example, flash memory, Static Random Access Memory (SRAM), Dynamic Random Access Memory (DRAM), analog circuits, and digital circuits, e.g., a logic gate. The stack-type semiconductor package can implement a memory device of high capacity, and has a reduced signal transmission path. Thus, the stack-type semiconductor device has high operation speed and low power consumption due to the reduced signal transmission path.

SUMMARY OF THE INVENTION

An exemplary embodiment of the present invention provides an electronic device including a stack-type semiconductor package with a reduced thickness and a method of forming the same.

According to an exemplary embodiment of the present invention, an electronic device comprises a lower electronic part including a lower substrate, a lower chip structure disposed on the lower substrate, and a lower molding layer covering the lower chip structure and having a recessed region in an upper surface of the lower molding layer, and an upper electronic part including an upper substrate disposed on the lower electronic part, and an upper chip structure projecting from the upper substrate, wherein the recessed region of the lower molding layer receives the upper chip structure.

The lower substrate can be a printed circuit board, and the lower chip structure may include a semiconductor chip connected to the lower substrate in a wire bonding structure or in a flip-chip structure.

The upper substrate can be a printed circuit board, and the upper chip structure may include a semiconductor chip connected to the upper substrate in a wire bonding structure or in a flip-chip structure.

The electronic device may further comprise an insulating protection layer covering the upper chip structure and disposed in the recessed region.

The upper substrate can be a printed circuit board having an opening, and the upper chip structure may include an upper chip contacting the upper substrate around the opening, and wires electrically connecting the upper chip exposed by the opening to the upper substrate, wherein each of the wires has a first end contacting the upper chip exposed by the opening and a second end contacting the upper substrate adjacent to the opening through the opening.

The electronic device may further comprise a protection layer filling the opening of the upper substrate, covering the wires, and projecting from a surface opposite to a surface of the upper substrate contacting the upper chip.

The electronic device may further comprise a first substrate disposed on the upper substrate, a first molding layer interposed between the first substrate and the upper substrate and having a first recessed region surrounding a sidewall of the protection layer projecting from the upper substrate, and a first chip structure electrically connected to the first substrate and disposed in the first molding layer.

The electronic device may further comprise a connection structure disposed at both sides of the lower and upper chip structures, and contacting the lower substrate and the upper substrate to electrically connect the lower electronic part to the upper electronic part.

The connection structure may include a single ball structure, a multiple ball structure, a spacer structure or a through electrode structure.

The electronic device may further comprise a semiconductor package provided on the upper electronic part, wherein the semiconductor package is a single chip semiconductor package or a multi chip semiconductor package.

The electronic device may further comprise a ball structure disposed opposite to the lower chip structure with the lower substrate interposed therebetween.

The electronic device may further comprise a processor for performing data communication with a first electronic part including the lower electronic part and the upper electronic part, and an input/output unit for performing data communication with the processor.

The electronic device may further comprise a board mounting the processor and the first electronic part thereon.

The electronic device may further comprise a substrate body mounting the first electronic part including the lower electronic part and the upper electronic part thereon, wherein the substrate body includes a plurality of tabs.

The electronic device may further comprise discrete devices disposed on the substrate body, wherein each of the discrete devices is spaced apart from the first electronic part.

According to an exemplary embodiment of the present invention, a method of forming an electronic device comprises forming a lower chip structure on a lower substrate, forming a lower molding layer on the lower chip structure, wherein the lower molding layer covers the lower chip structure and has a recessed region on an upper surface of the lower molding layer, thereby forming a lower electronic part including the lower substrate, the lower chip structure, and the lower molding layer, forming an upper electronic part including an upper substrate and an upper chip structure disposed on the upper substrate, and disposing the upper chip structure into the recessed region of the lower molding layer to combine the upper electronic part with the lower electronic part.

The lower substrate can be a printed circuit board, and the lower chip structure may include a semiconductor chip connected to the lower substrate in a wire bonding structure or in a flip-chip structure.

The upper substrate can be a printed circuit board, and the upper chip structure may include a semiconductor chip connected to the upper substrate in a wire bonding structure or in a flip-chip structure.

The method may further comprise forming a protection layer covering the upper chip structure on the upper substrate, wherein the protection layer is disposed in the recessed region.

Forming the upper electronic part may comprise preparing a printed circuit board having an opening as the upper substrate, and forming the upper chip structure contacting the printed circuit board around the opening.

The method may further comprise forming a protection layer filling the opening of the upper substrate, and projecting from a surface opposite to a surface contacting the upper chip structure of the upper substrate, forming a first electronic part including a first substrate, a first chip structure disposed on the first substrate, and a first molding layer covering the first chip structure and having a first recessed region in an upper surface on the first substrate, and combining the first electronic part with the upper electronic part so that the protection layer is disposed in the first recessed region of the first electronic part.

The lower electronic part and the upper electronic part can be combined by a connection structure disposed at both sides of the lower and upper chip structures, the connection structure contacting the lower substrate and the upper substrate to electrically connect the lower electronic part to the upper electronic part.

Combining the lower electronic part with the upper electronic part may comprise forming a through electrode structure passing through the upper substrate disposed at both sides of the upper chip structure and passing through the lower molding layer disposed at both sides of the lower chip structure to be connected to the lower substrate.

The method may further comprise forming a ball structure disposed opposite to the lower chip structure with the lower substrate interposed therebetween.

The method may further comprise stacking a single chip semiconductor package or a multi chip semiconductor package on the upper electronic part.

According to an exemplary embodiment of the present invention, a stack-type semiconductor package comprises a lower substrate, a lower chip disposed on the lower substrate, a lower molding layer disposed on the lower chip, the lower molding layer having a recessed region with a first depth, an upper substrate, an upper chip disposed on the upper substrate, and an upper molding layer disposed on the upper chip, wherein a substantial portion of the first depth of the recessed region receives the upper molding layer of the upper substrate.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF EXEMPLARY EMBODIMENTS

The present invention will be described more fully hereinafter with reference to the accompanying drawings, in which exemplary embodiments of the invention are shown. This invention may, however, be embodied in different forms and should not be construed as limited to the exemplary embodiments set forth herein.

Referring to FIGS. 1A, 1B, 1C, 2A, 2B, and 2C, elements constituting an electronic device having a stack-type semiconductor package according to exemplary embodiments of the present invention are described. Referring to FIGS. 3, 4, 5A, 5B, and 6 to 13, an electronic device having a stack-type semiconductor package formed using the elements is described according to exemplary embodiments of the present invention.

Figure 1A:
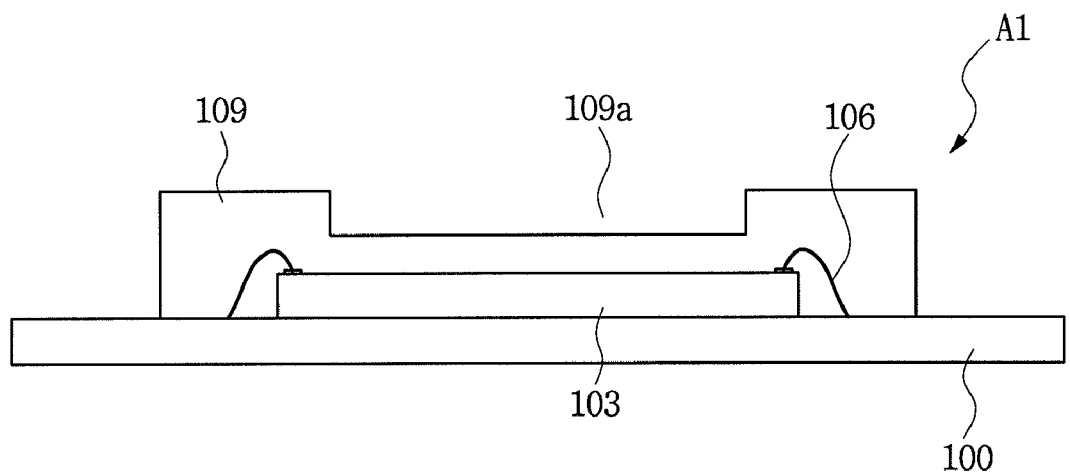
FIGS. 1A to 1C are cross-sectional views of lower packages constituting a stack-type semiconductor package according to exemplary embodiments of the present invention.
Figure 1B:
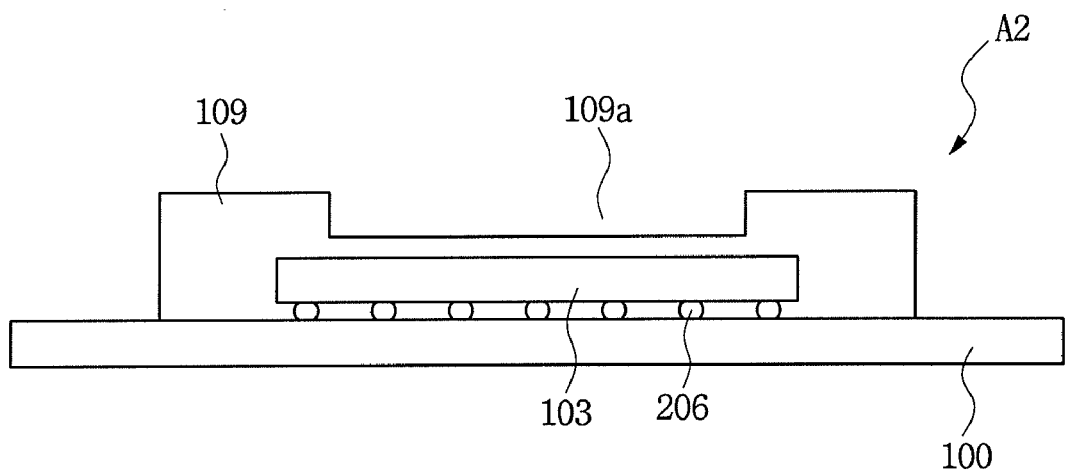
Figure 1C:
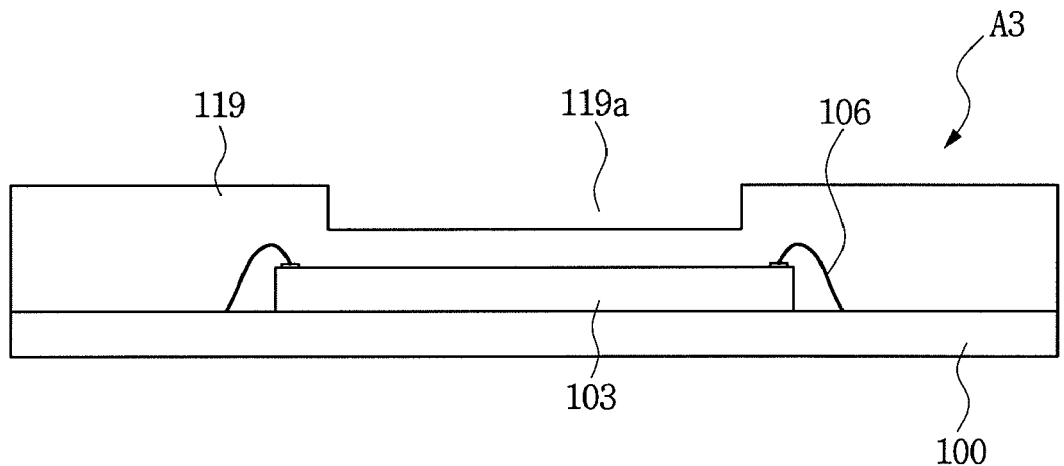

Referring to FIGS. 1A, 1B and 1C, a lower substrate 100, a lower chip 103, wires 106, lower molding layers 109 and 119, and a ball structure 206 are provided. The lower substrate 100 may be a printed circuit board. A lower chip 103 may be provided on the lower substrate 100. Referring to FIG. 1A, the lower chip 103 may be electrically connected to the lower substrate 100 in a wire bonding structure. For example, wires 106 connect the lower chip 103 to the lower substrate 100. The lower chip 103 and the wires 106 constitute a lower chip structure. Referring to FIG. 1B, the lower chip 103 may be electrically connected to the lower substrate 100 in a flip-chip structure. For example, the ball structure 206 may be provided between the lower chip 103 and the lower substrate 100 to electrically connect the lower chip 103 to the lower substrate 100. The lower chip 103 and the ball structure 206 constitute a lower chip structure.

The lower molding layers 109 and 119 are formed on the lower substrate 100. The lower molding layers 109 and 119 cover the lower chip 103 and have recessed regions 109a and 119a, respectively, in each upper surface of the lower molding layers 109 and 119. When the lower chip 103 is connected to the lower substrate 100 through the wires 106, the lower molding layers 109 and 119 may cover the wires 106 and the lower chip 103. In an exemplary embodiment, the lower molding layer 109 may expose the lower substrate 100 around the lower chip 103. For example, a peripheral portion of the lower substrate 100 is not covered by the lower molding layer 109.

Referring to FIGS. 1A and 1B, A1 is a first lower package and A2 is a second lower package. In the first lower package (A1), the lower chip 103 is connected to the lower substrate 100 in a wire bonding structure. In the second lower package (A2), the lower chip 103 is connected to the lower substrate 100 in a flip-chip structure.

Referring to FIG. 1C, a lower molding layer 119 covers the lower chip 103 and the lower substrate 100. The lower molding layer 119 covers around the lower chip 103. For example, a peripheral portion of the lower substrate 100 is substantially covered by the lower molding layer 119. A recessed region 119a can be formed in an upper surface of the lower molding layer 119. A third lower package A3 includes the lower substrate 100, the lower chip 103 connected to the lower substrate 100 in a wire bonding structure or in a flip-chip structure, and the lower molding layer 119 having the recessed region 119a.

Elements constituting a stack-type semiconductor package according to exemplary embodiments of the present invention are described with reference to FIGS. 2A to 2C.

Figure 2A:
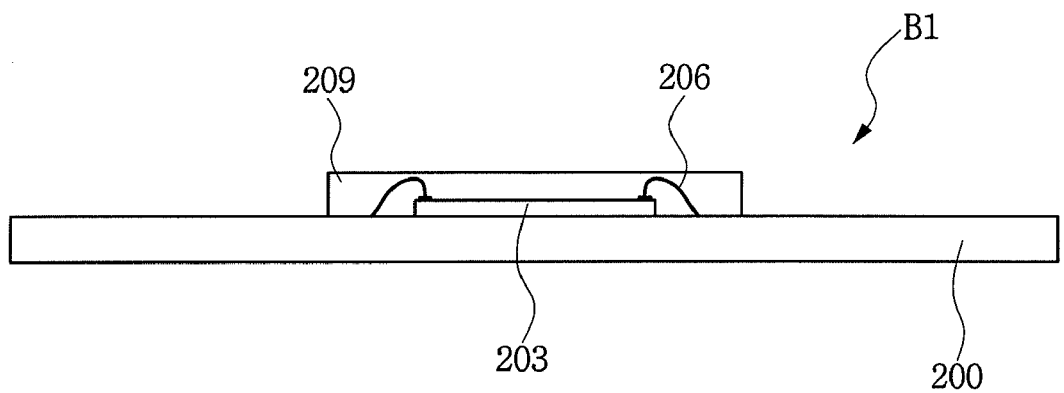
FIGS. 2A to 2C are cross-sectional views of upper packages constituting a stack-type semiconductor package according to exemplary embodiments of the present invention.

Referring to FIG. 2A, a first upper package (B1) includes a first upper substrate 200, a first upper chip 203, wires 206 and an upper molding layer 209. The first upper substrate 200 may be a printed circuit board. The first upper chip 203 may be provided on the first upper substrate 200. The first upper chip 203 may be a semiconductor chip. The first upper chip 203 may be electrically connected to the first upper substrate 200 in a wire bonding structure. That is, the wires 206 electrically connect the first upper substrate 200 to the first upper chip 203. The first upper chip 203 and the wires 206 constitute a first upper chip structure.

The upper molding layer 209 may be provided on the first upper substrate 200. The upper molding layer 209 can be a protection layer, and covers the first chip 203 and the wires 206. The upper molding layer 209 may expose the first upper substrate 200 around the first upper chip 203. The upper molding layer 209 may have a size corresponding to the recessed region (109a of FIGS. 1A and 1B) of the lower molding layer (109 of FIGS. 1A and 1B).

Figure 2B:
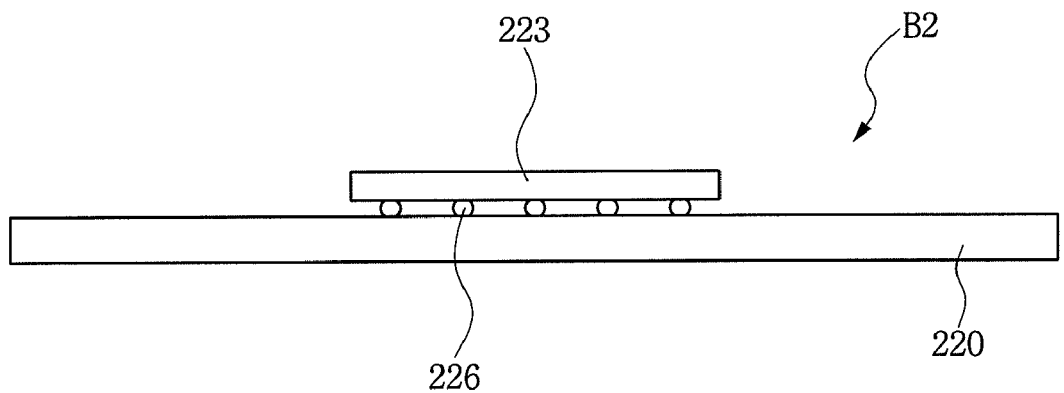

Referring to FIG. 2B, a second upper package B2 includes a second upper substrate 220, a second upper chip 223, and a ball structure 226. The second upper substrate 220 may be a printed circuit board. The second upper chip 223 may be provided on the second upper substrate 220. The second upper chip 223 may be electrically connected to the second upper substrate 220 in a flip-chip structure. That is, the ball structure 226 may be interposed between the second upper chip 223 and the second upper substrate 220 to electrically connect the second upper chip 223 to the second upper substrate 220. The second upper chip 223 and the ball structure 226 may constitute a second upper chip structure. The second upper chip 223 may have a size equal to or smaller than the recessed region (109a of FIGS. 1A and 1B) of the lower molding layer (109 of FIGS. 1A and 1B).

Figure 2C:
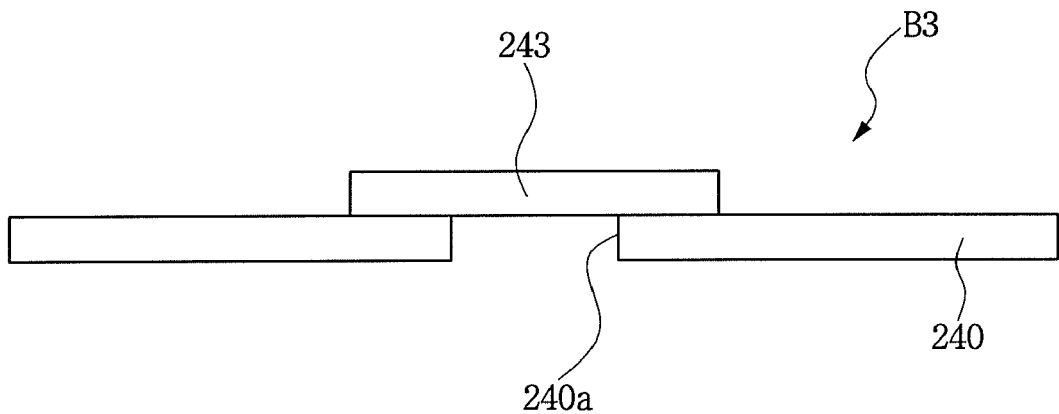

Referring to FIG. 2C, a third upper package B3 includes a third upper substrate 240, and a third upper chip 243. The third upper substrate 240 may be a printed circuit board having at least one opening 240a. The opening 240a may pass through the third upper substrate 240. The third upper chip 243 larger than the opening 240a may be provided on the third upper substrate 240. The third upper chip 243 may cover the opening 240a of the third upper substrate 240 and may contact the third upper substrate 240 around the opening 240a.

The first to third lower packages A1, A2 and A3, and the first to third upper packages B1, B2 and B3 may be used as electronic components constituting an electronic device according to exemplary embodiments of the present invention.

A method of forming the first to third lower packages A1, A2 and A3 and the first to third upper packages B1, B2 and B3 are described with reference to FIGS. 1A, 1B, 1C, 2A, 2B and 2C.

Referring to FIG. 1A, the lower substrate 100 is prepared. The lower substrate 100 may be a printed circuit board. The lower chip 103 may be prepared. The lower chip 103 may be a semiconductor chip. The lower chip 103 may be formed on the lower substrate 100. The lower chip 103 may contact the lower substrate 100 through an adhesive. Then, a wire bonding process is preformed to form the wires 106 electrically connecting the lower chip 103 to the lower substrate 100. As a result, the lower chip 103 may be electrically connected to the lower substrate 100 in a wire bonding structure. The lower chip 103 and the wires 106 constitute a lower chip structure according to an exemplary embodiment of the present invention.

Referring to FIG. 1B, the lower chip 103 may be connected to the lower substrate 100 in a flip-chip structure. That is, the ball structure 206 is formed under the lower chip 103, and the ball structure 206 contacts the lower substrate 100, so that the lower chip 103 can be in contact with and electrically connected to the lower substrate 100. The lower chip 103 and the ball structure 206 constitute a lower chip structure according to an exemplary embodiment of the present invention.

A lower molding layer 109 covering the lower chip 103 and having a recessed region 109a in its upper surface may be formed on the lower substrate 100. When the lower chip 103 is connected to the lower substrate 100 through the wires 106, the lower molding layer 109 may cover the wires 106 and the lower chip 103. The lower molding layer 109 may expose the lower substrate 100 around the lower chip 103. The recessed region 109a of the lower molding layer 109 may be disposed on the lower chip 103. The lower molding layer 109 may comprise a molded resin compound using a mold having a projecting portion corresponding to the recessed region 109a. In an exemplary embodiment, the lower molding layer 109 may be formed to have a plane upper surface using a molded resin compound, and then the recessed region 109a may be formed using, for example, laser.

Referring to FIG. 1C, a lower molding layer 119 covering both the lower chip 103 and the lower substrate 100 around the lower chip 103 may be formed. The lower molding layer 119 may have the recessed region 119a in its upper surface. Accordingly, the third lower package A3 includes the lower substrate 100, the lower chip 103 connected to the lower substrate 100 in a wire bonding structure or in a flip-chip structure, and the lower molding layer 119 having the recessed region 119a.

Referring to FIG. 2A, the first upper substrate 200 is prepared. The first upper substrate 200 may be a printed circuit board. The first upper chip 203 may be prepared. The first upper chip 203 may be a semiconductor chip. The first upper chip 203 may be formed on the first upper substrate 200. The first upper chip 203 may contact the first upper substrate 200 through an adhesive. Then, a wire bonding process may be performed to form the wires 206 electrically connecting the first upper chip 203 to the first upper substrate 200. Accordingly, the first upper chip 203 may be electrically connected to the first upper substrate 200 in a wire bonding structure. The first upper chip 203 and the wires 206 constitute the first upper chip structure.

The upper molding layer 209 covering the first upper chip 203 and the wires 206 may be formed on the first upper substrate 200. The upper molding layer 209 can function as a protection layer. The upper molding layer 209 may expose the first upper substrate 200 around the first upper chip 203.

The upper molding layer 209 may have a size corresponding to the recessed region (109a of FIGS. 1A and 1B) of the lower molding layer (109 of FIGS. 1A and 1B).

Referring to FIG. 2B, a second upper chip structure B2 includes the second upper substrate 220, a ball structure 226 and the second upper chip 223. The second upper substrate 220 may be a printed circuit board. The second upper chip 223 is formed on the second upper substrate 220. The second upper chip 223 may be electrically connected to the second upper substrate 220 in a flip-chip structure. For example, the ball structure 226 is formed under the second upper chip 223, and the ball structure 226 contacts the second upper substrate 220 to electrically connect the second upper chip 223 to the second upper substrate 220.

The second upper chip 223 may have a size equal to or smaller than the recessed region (109a of FIGS. 1A and 1B) of the lower molding layer (109 of FIGS. 1A and 1B). In other words, the recessed region (109a of FIGS. 1A and 1B) of the lower molding layer (109 of FIGS. 1A and 1B) may be formed taking into account the size of the second upper chip 223. For example, the recessed region 109a can receive the second upper chip 223.

Referring to FIG. 2C, a third upper package B3 includes a third upper substrate 240 and the third upper chip 243. The third upper substrate 240 may be a printed circuit board. The third upper substrate 240 may have at least one opening 240a. The opening 240a may pass through the third upper substrate 240. The third upper chip 243 is larger than the opening 240a. The third upper chip 243 may be formed on the third upper substrate 240. The third upper chip 243 may cover the opening 240a of the third upper substrate 240 and may contact the third upper substrate 240 around the opening 240a.

In an exemplary embodiment of the present invention, a stack-type semiconductor package may be formed by combining one of the lower packages A1, A2 and A3 with one of the upper packages B1, B2 and B3. An electronic device formed by combining one of the lower packages A1, A2 and A3 with one of the upper packages B1, B2 and B3 is described below.

A method of forming an electronic device having a stack-type semiconductor package according to an exemplary embodiment of the present invention is described with reference to FIGS. 3 and 4.

Figure 3:
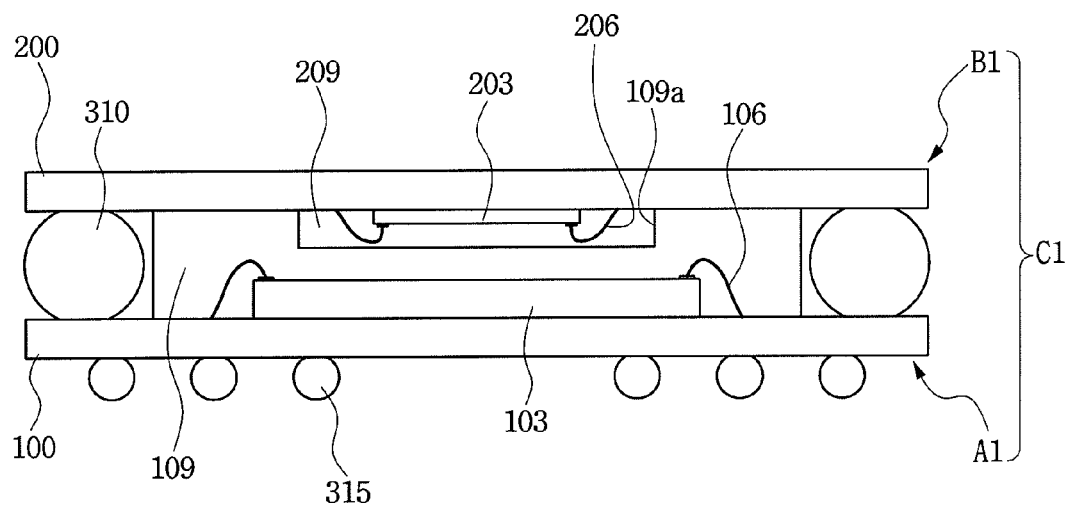
FIGS. 3 and 4 are cross-sectional views of stack-type semiconductor packages according to exemplary embodiments of the present invention.

Referring to FIG. 3, a first stack-type semiconductor package C1 includes the first lower package A1 and the first upper package B1, which are electrically connected to and combined with each other by a single ball structure 310. The first upper package B1 is combined with the first lower package A1. The first upper chip 203 and the upper molding layer 209 covering the first upper chip 203 are disposed in the recessed region 109a of the lower molding layer 109 of the first lower package A1.

The first lower package A1 may be combined with the first upper package B1 by a connection structure, e.g., the single ball structure 310. In an exemplary embodiment, the lower molding layer 109 may expose the lower substrate 100 around the lower chip 103. The conductive single ball structure 310 may be formed on the exposed lower substrate 100, and the single ball structure 310 may be used to connect the lower substrate 100 to the upper substrate 200. Alternatively, after a conductive single ball structure 310 is formed on the lower substrate 100, the lower substrate 100 may be connected to the upper substrate 200 using the single ball structure 310.

A ball structure 315 is disposed at an opposite side of the first lower chip 103. The first lower substrate 100 is interposed between the first lower chip 103 and the ball structure 315. The ball structure 315 is electrically connected to the first lower substrate 100. The ball structure 315 connected to the first lower substrate 100 may be formed before or after the first upper package B1 is combined with the first lower package A1.

Figure 4:
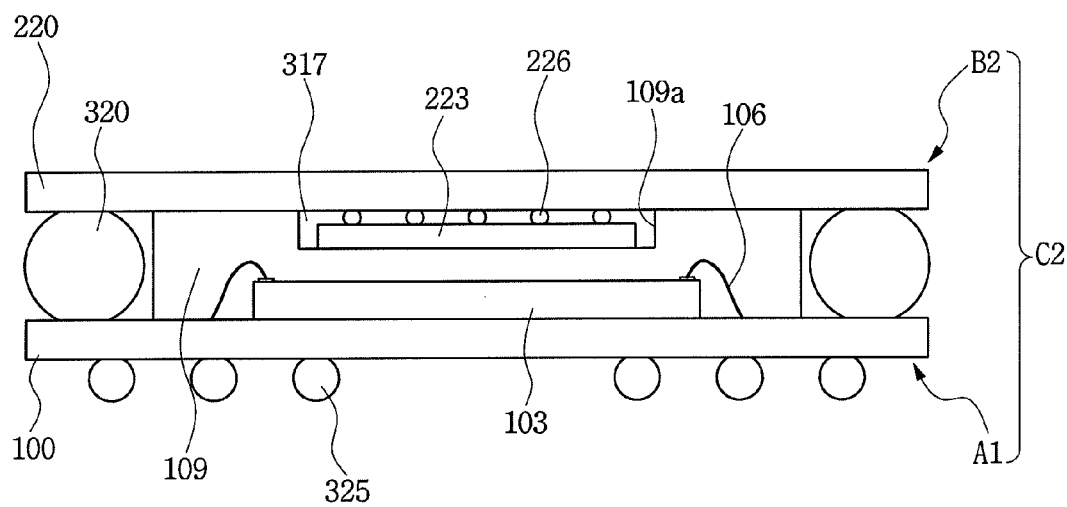

Referring to FIG. 4, a second stack-type semiconductor package C2 includes the first lower package A1 and the second upper package B2, which are electrically connected to and combined with each other by the connection structure, e.g., a single ball structure 320. For example, the first lower package A1 is combined with the second upper package B2 using the single ball structure 320. The second lower chip 223 of the second upper package B2 is disposed in the recessed region 109a of the first lower package A1.

When the recessed region 109a is not fully filled with the second lower chip 223, an insulating protection layer 317 may be formed in the recessed region 109a. For example, the insulating protection layer 317 may be injected in a liquid state through a hole (not shown) of the second upper substrate 220. The liquid state insulating protection layer 317 becomes a solid state insulating protection layer 317 subsequently. For example, the hole of the first upper substrate 200 may be formed when preparing the second upper substrate 220.

A ball structure 325 can be disposed at an opposite side of the first lower chip 103 with the first lower substrate 100 interposed therebetween. The ball structure 325 can be electrically connected to the first lower substrate 100. The ball structure 325 contacting the first lower substrate 100 may be formed before or after the second upper package B2 is combined with the first lower package A1.

A method of forming a stack-type semiconductor package according to an exemplary embodiment of the present invention is described below with reference to FIGS. 5A and 5B.

Figure 5A:
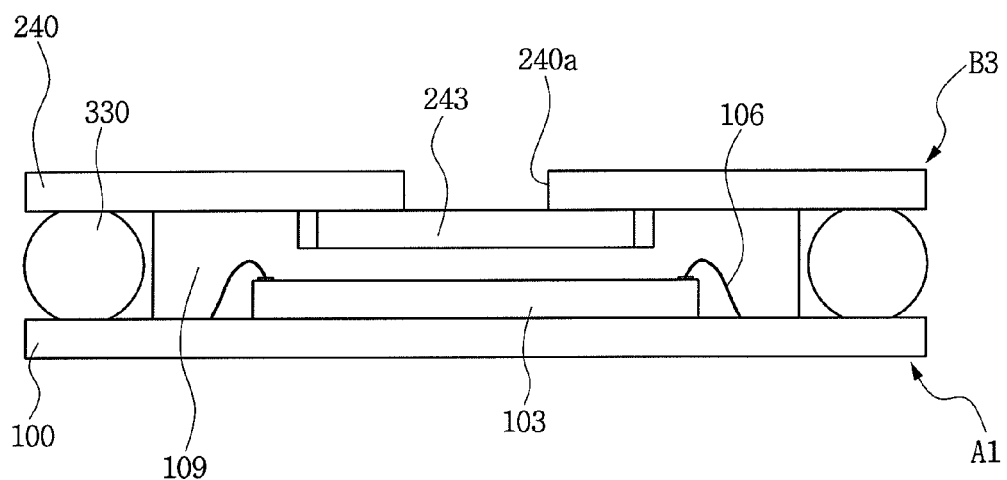
FIGS. 5A and 5B are cross-sectional views of stack-type semiconductor packages according to exemplary embodiments of the present invention.
Figure 5B:
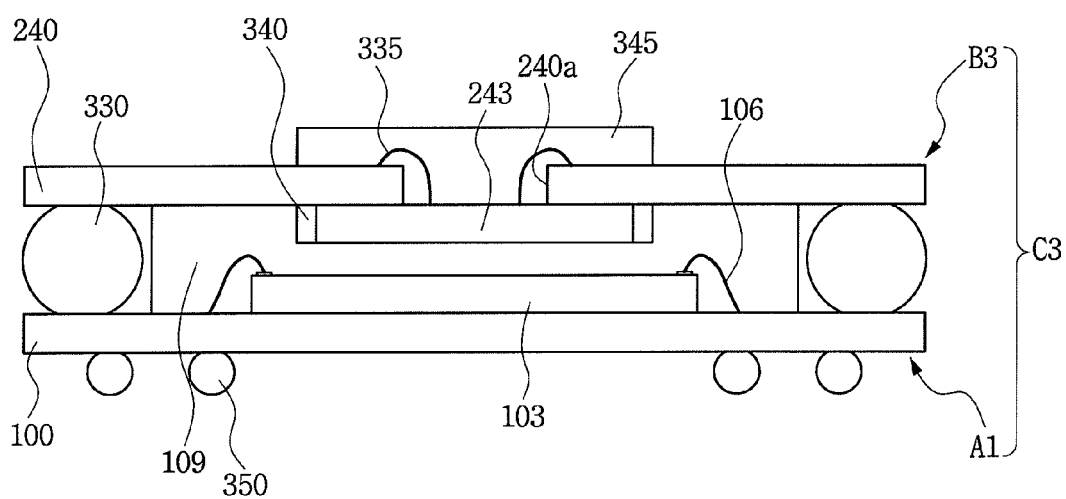

Referring to FIG. 5A and FIG. 5B, a third stack-type semiconductor package C3 includes the first lower package A1 and a third upper package B3. The third upper package B3 may be combined with the first lower package A1 so that the third upper chip 243 is disposed in the recessed region 119a of the lower molding layer 109. For example, the first lower package A1 may be combined with the third upper package B3 using a ball structure 330.

The third upper substrate 240 may be electrically connected to the third upper chip 243 using a wire bonding process. For example, a wire bonding process may be performed to form wires 335. The wires 335 connect the third upper chip 243 exposed by the opening 240a of the third upper substrate 240 to a surface opposite to a surface where the third upper chip 243 is combined with the third upper substrate 240. In other words, the wires 335 may electrically connect the third upper chip 243 exposed by the opening 240a to the third 20 upper substrate 240. Each of the wires 335 has one end contacting the third upper chip 243 exposed by the opening 240a, and the other end contacting the third upper substrate 240 adjacent to the opening 240a through the opening 240a. A protection layer 345 filling the opening 240a and covering the wires 335 may be formed.

When the recessed region 109a is not fully filled with the third upper chip 243, an insulating protection layer 340 may be formed in the recessed region 109a. For example, the insulating protection layer 340 may be injected in a liquid state through a hole (not shown) of the third upper substrate 240. The liquid state insulating protection layer changes into a solid state insulating protection layer subsequently. In an exemplary embodiment, the hole of the third upper substrate 240 may be formed when preparing the third upper substrate 240.

The ball structure 330 contacts one side of the first lower substrate 100 with the first lower chip 103 interposed therebetween. The ball structure 330 contacting the first lower substrate 100 may be formed before or after the third upper package B3 is combined with the first lower package A1.

The thicknesses of the first to third stack-type semiconductor packages C1, C2 and C3 may be minimized according to exemplary embodiments of the present invention. This is because the first to third upper chips 203, 223 and 243 of the first to third upper packages B1, B2 and B3 are disposed in the recessed region 109a of the first lower package A1. That is, the thickness of a stack-type semiconductor package according to exemplary embodiments of the present invention may be reduced.

In FIGS. 3, 4 and 5B, the first to third stack-type semiconductor packages C1, C2 and C3 are formed by combining the first lower package A1 with one of the first to third upper packages B1, B2 and B3 using the above-described connection structure. However, it is not limited thereto. For example, the first to third stack-type semiconductor packages C1, C2 and C3 may be formed using the second lower package A2 instead of the first lower package A1. This is because, in an exemplary embodiment, the first lower package A1 and the second lower package A2 are in the same shape, so that even if the second lower package A2 is used instead of the first lower package A1, a s method of forming the first to third stack-type semiconductor packages C1, C2 and C3 is the same.

The single ball structures 310, 320 and 330 may be used to combine the first lower package A1 with one of the first to third upper packages B1, B2 and B3 in FIGS. 3, 4, 5A and 5B. However, it is not limited thereto.

Figure 6:
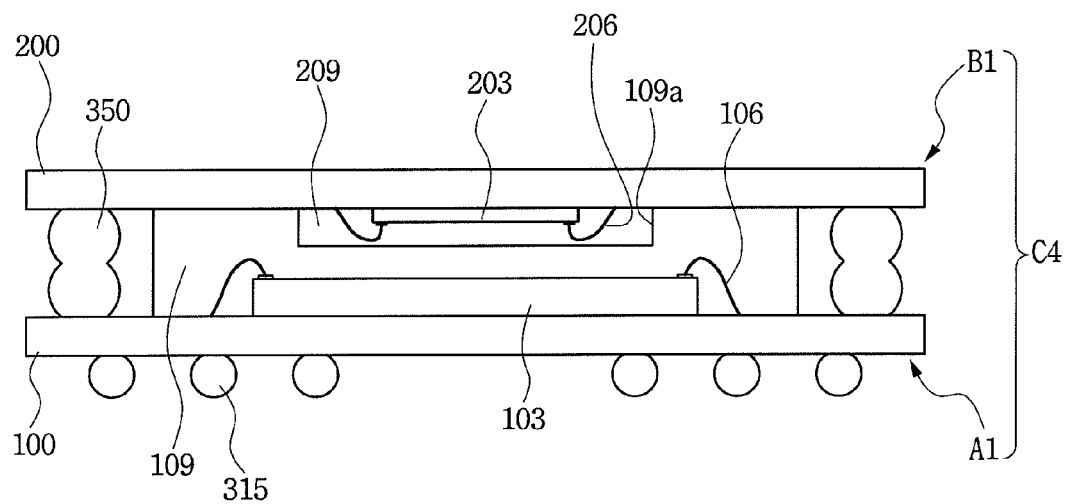
FIGS. 6 and 7 are cross-sectional views of stack-type semiconductor packages according to exemplary embodiments of the present invention.

Referring to FIG. 6, a fourth stack-type semiconductor package C4 includes the first lower package A1 and the first upper package B1, which are combined by a multiple ball structure 350, according to an exemplary embodiment of the present invention. The multiple ball structure 350 includes a plurality of balls vertically stacked.

Figure 7:
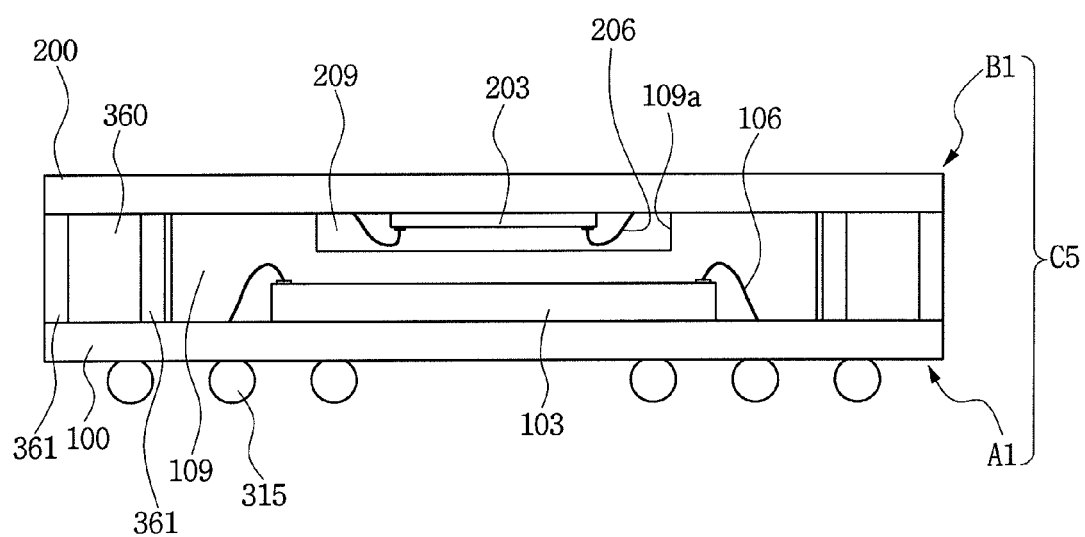

Referring to FIG. 7, a fifth stack-type semiconductor package C5 includes the first lower package A1 and the first upper package B1, which are combined by the spacer structure according to an exemplary embodiment of the present invention. The spacer structure including an insulating PCB spacer 361 and a conductive spacer 360 passing through the PCB spacer 361 may be used for combining the first lower package A1 with the first upper package B1. For example, a module of the spacer structure may be manufactured by a separate process, and then is disposed between the first lower package A1 and the first upper package B1. Afterwards, an annealing process may be performed so that the conductive spacer 360 contacts the first lower package A1 and the first upper package B1.

Figure 8:
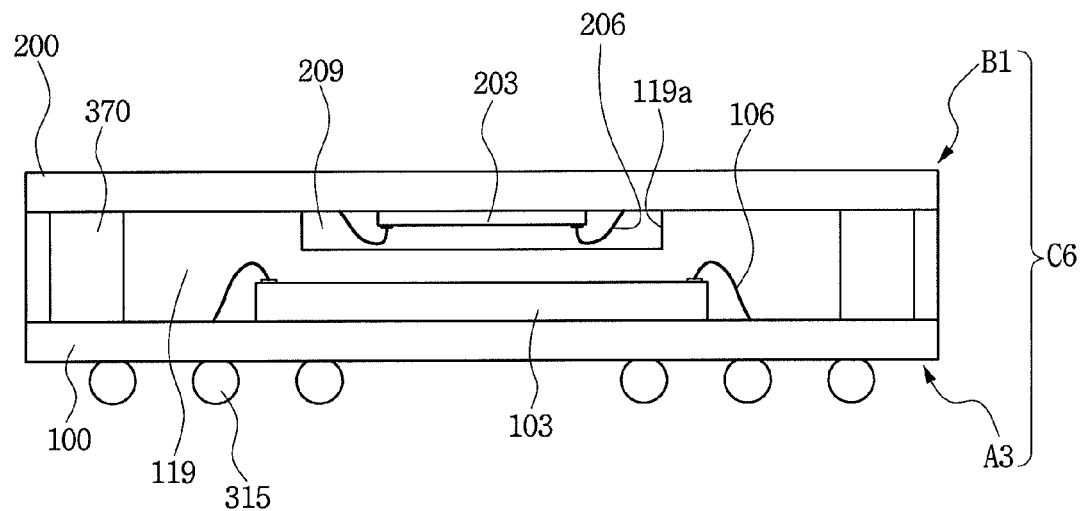
FIG. 8 is a cross-sectional view of a stack-type semiconductor package according to an exemplary embodiment of the present invention.

Referring to FIG. 8, a sixth stack-type semiconductor package C6 includes the third lower package A3 combined with the first upper package B1 by a connection structure such as a through electrode structure 370. In an exemplary embodiment, the first upper chip 203 and the upper molding layer 209 covering the first upper chip 203 may be disposed in the recessed region 119a of the lower molding layer 119. The through electrode structure 370 may pass through the lower molding layer 119 around the lower chip 103 to be electrically connected to both the first lower substrate 100 and the first upper substrate 200. For example, the through electrode structure 370 passing through the lower molding layer 119 may be formed on the third lower package A3. The first upper package B1 may be disposed on the third lower package A3. An annealing process may be performed so that the through electrode structure 370 contacts and/or adheres to pads (not shown) of the first upper substrate 200. In an exemplary embodiment, the first upper package B1 may be disposed on the third lower package A3, and a connection structure, e.g., the through electrode structure 370 may be formed through the molding layer 119.

Therefore, the connection structure for combining a lower package with an upper package may be provided in various forms including, for example, a single ball structure, a multiple ball structure, a spacer structure, or a through electrode structure according to exemplary embodiments of the present invention.

A stack-type semiconductor package formed by stacking a single semiconductor package on a stack-type semiconductor package is described with reference to FIG. 9 according to an exemplary embodiment of the present invention.

Figure 9:
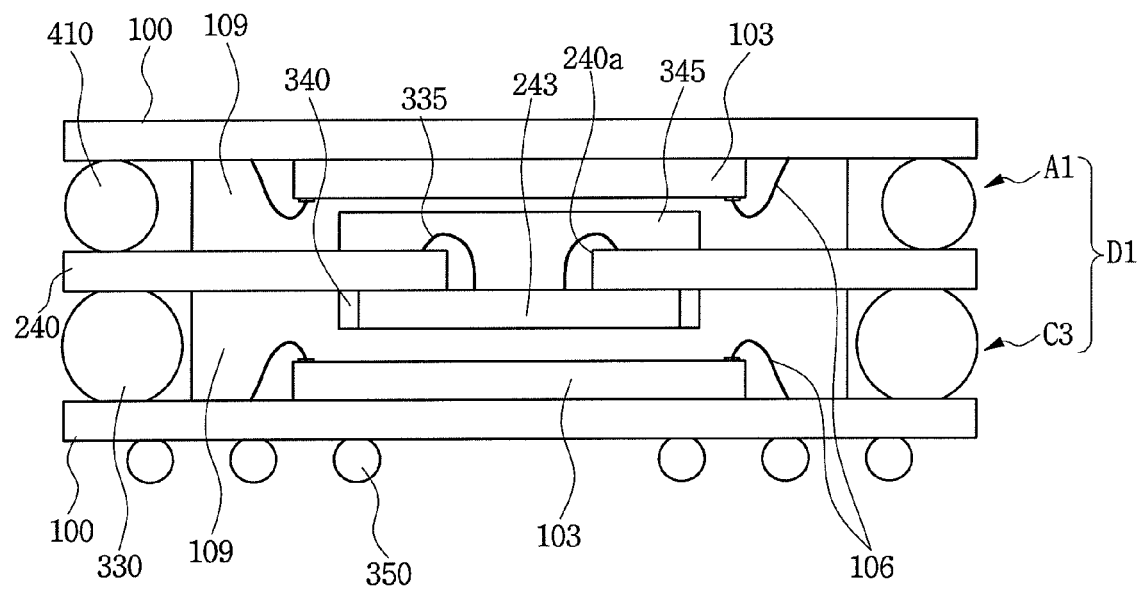
FIG. 9 is a cross-sectional view of a stack-type semiconductor package according to an exemplary embodiment of the present invention.

Referring to FIG. 9, a seventh stack-type semiconductor package D1 includes the third stack-type semiconductor package C3, the first lower package A1, and a connection structure 410 according to an exemplary embodiment of the present invention. The first lower package A1 may be stacked on the third stack-type semiconductor package C3 to be combined using a connection structure, e.g., the ball structure 410. The ball structure 410 may be formed in the various shapes such as, for example, a multiple ball structure, a spacer structure, or a through electrode structure.

The protection layer 345 of the third stack-type semiconductor package C3 may have a size corresponding to the recessed region 109a of the first lower package A1. Therefore, the third stack-type semiconductor package C3 may be combined with the first lower package A1 using the ball structure 410 so that the protection layer 345 is disposed in the recessed region 109a.

In an exemplary embodiment of the present invention, the second lower package A2 or the third lower package A3 may be stacked on the third stack-type semiconductor package C3 to be combined using a connection structure, e.g., the ball structure 410.

In an exemplary embodiment, a stack-type semiconductor package, in which one of the first, second, fourth and fifth stack-type semiconductor packages C1, C2, C4, and C5 is combined with one of the first to third lower packages A1, A2 and A3, may be formed. For example, one of the first to third lower packages A1, A2 and A3 may be combined with one of the first, second, fourth and fifth stack-type semiconductor packages C1, C2, C4, and C5 in a flip-chip structure.

In an exemplary embodiment of the present invention, a stack-type semiconductor package may be formed by stacking one of the first to third stack-type semiconductor packages C1, C2 and C3 on one of the first to third stack-type semiconductor packages C1, C2 and C3. For example, a stack-type semiconductor package formed by the combination of the first stack-type semiconductor package C1 and the first stack-type semiconductor package C1, by the combination of the first stack-type semiconductor package C1 and the second stack-type semiconductor package C2, by the combination of the first stack-type semiconductor package C1 and the third stack-type semiconductor package C3, by the combination of the second stack-type semiconductor package C2 and the second stack-type semiconductor package C2, or by the combination of the third stack-type semiconductor package C3 and the third stack-type semiconductor package C3. In an exemplary embodiment, at least one of the first to third stack-type semiconductor packages C1, C2 and C3 may employ the connection structures 350, 360 and 370.

Figure 10:
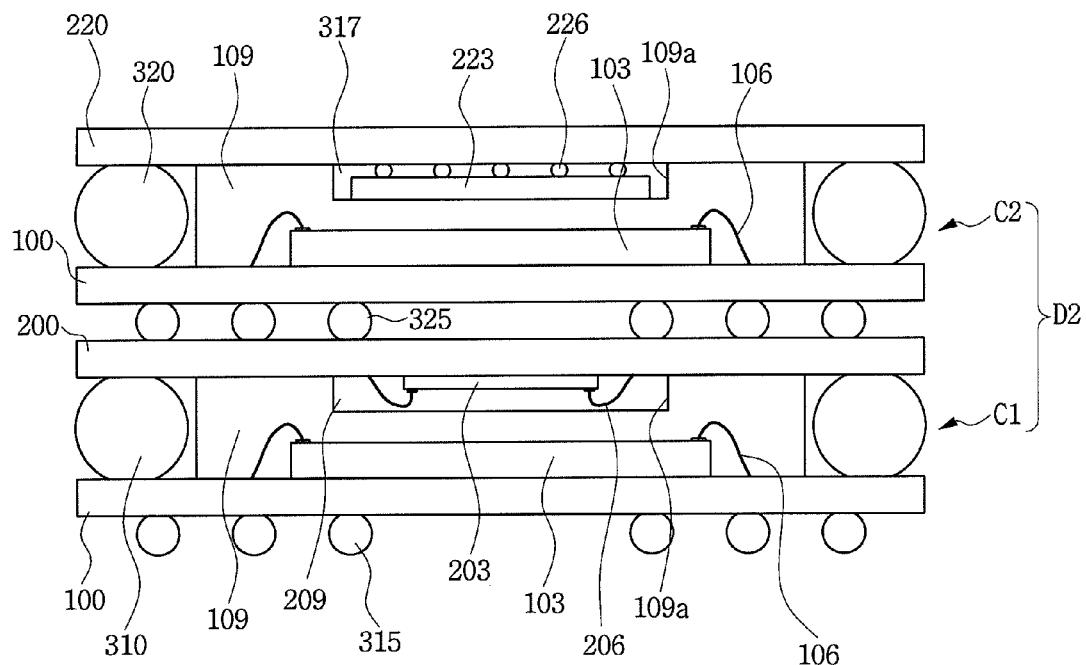
FIGS. 10 and 11 are cross-sectional views of stack-type semiconductor packages according to exemplary embodiments of the present invention.

Referring to FIG. 10, an eighth stack-type semiconductor package D2 includes the first stack-type semiconductor package C1 combined with the second stack-type semiconductor package C2. The first stack-type semiconductor package C1 may include pads (not shown) in its upper surface. A semiconductor package in a flip-chip structure may be stacked on the first stack-type semiconductor package C1 to form an eighth stack-type semiconductor package D2. For example, a second stack-type semiconductor package C2 is stacked on the first stack-type semiconductor package C1 to be combined with each other, so that the eighth stack-type semiconductor package D2 can be formed. The ball structure 325 of the second stack-type semiconductor package C2 contacts and is combined with the pads (not shown) of the first stack-type semiconductor package C1, so that the first stack-type semiconductor package C1 and the second stack-type semiconductor package C2 can be electrically connected to each other. In an exemplary embodiment, the first stack-type semiconductor package C1 may be stacked on the second stack-type semiconductor package C2 to be combined with each other.

According to an exemplary embodiment of the present invention, a semiconductor package in a flip-chip structure may be stacked on one of the first stack-type semiconductor package C1 and the second stack-type semiconductor package C2 to be combined.

Figure 11:
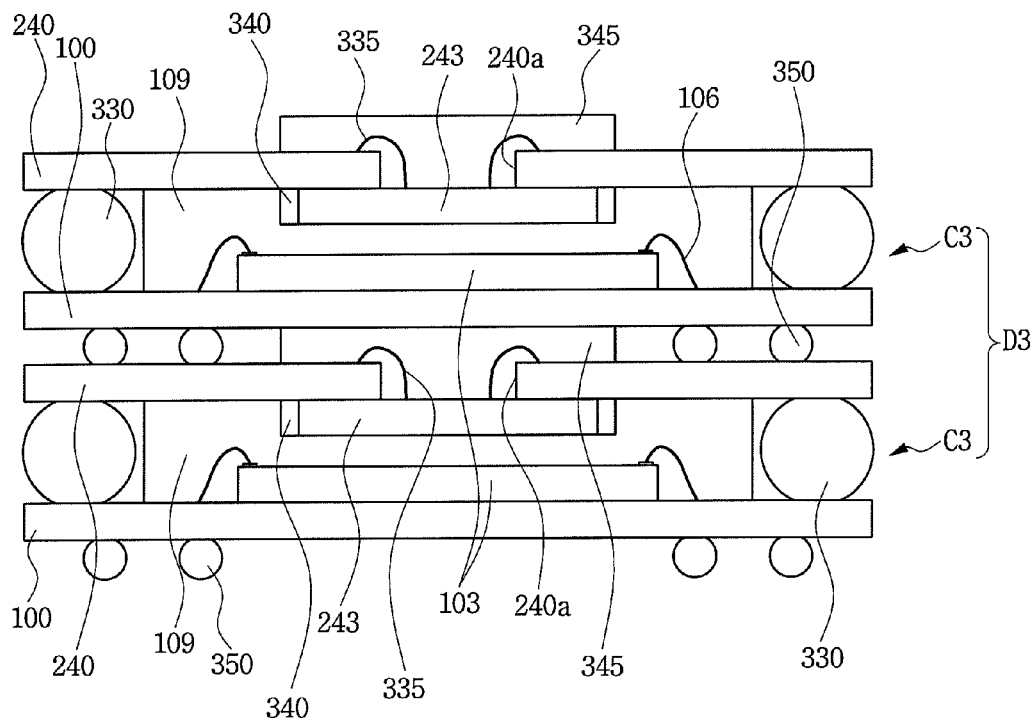

Referring to FIG. 11, a plurality of third stack-type semiconductor packages C3 are prepared. Each of the third stack-type semiconductor package C3 may include pads in its upper surface. The plurality of third stack-type semiconductor packages C3 may be sequentially stacked using the method shown in FIG. 10 to form a ninth stack-type semiconductor package D3. For example, the protection layer 345 of the third stack-type semiconductor package C3 may be disposed between the ball structures 350. The ball structures 350 of the third stack-type semiconductor package C3 may be disposed not to overlap the protection layer 345. In an exemplary embodiment, a ball structure of a stack-type semiconductor package in a flip-chip structure formed on the third stack-type semiconductor package C3 may be disposed not to overlap the protection layer 345 of the third stack-type semiconductor package C3. Accordingly, the thickness of the stack-type semiconductor package may be minimized.

Figure 12:
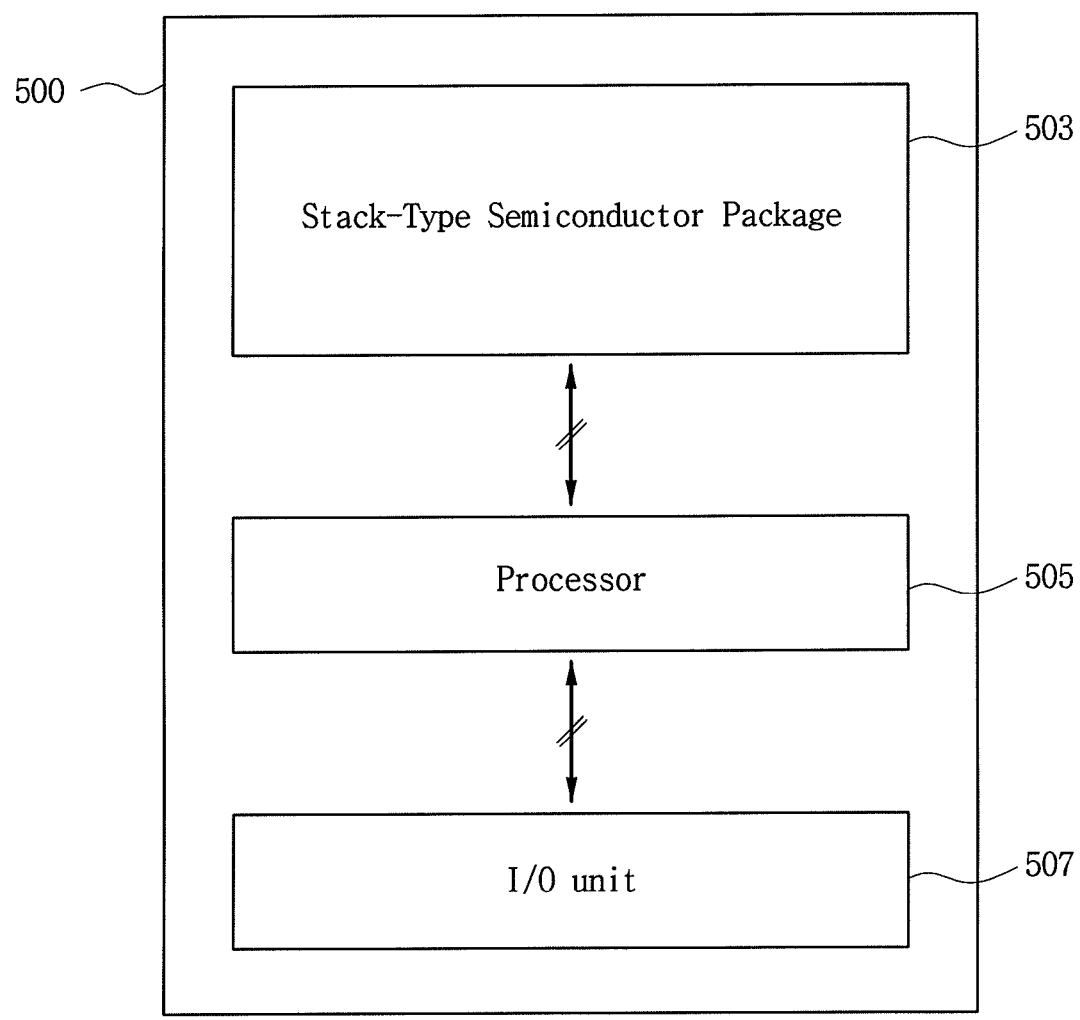
FIG. 12 is a schematic block diagram of an electronic device including a stack-type semiconductor package according to an exemplary of the present invention.

FIG. 12 is a schematic block diagram of an electronic device including a stack-type semiconductor package according to an exemplary embodiment of the present invention.

Referring to FIG. 12, the electronic device 500 includes a plurality of stack-type semiconductor packages 503 and a processor 505 connected to the plurality of stack-type semiconductor packages 503. The stack-type semiconductor packages 503 may be the stack-type semiconductor packages according to exemplary embodiments of the present invention. The stack-type semiconductor packages 503 may include semiconductor chips having various functions. The electronic device 500 may correspond to a part of an electronic product such as, for example, a notebook computer, a digital camera, a music player (e.g., MP3), or a cellular phone. In an exemplary embodiment, the processor 505 and the stack-type semiconductor packages 503 may be formed on a board, and the stack-type semiconductor packages 503 may function as a data storage medium for executing the processor 505.

The electronic device 500 may exchange data with other electric systems such as personal computers or computer networks through an input/output unit 507. The input/output unit 507 may provide data with, for example, a peripheral bus line of a computer, a high-speed digital transmission line or a wireless transmission/reception antenna. The data communication between the processor 505 and the stack-type semiconductor packages 503, and the data communication between the processor 505 and the input/output unit 507 may be performed using general bus architectures.

Figure 13:
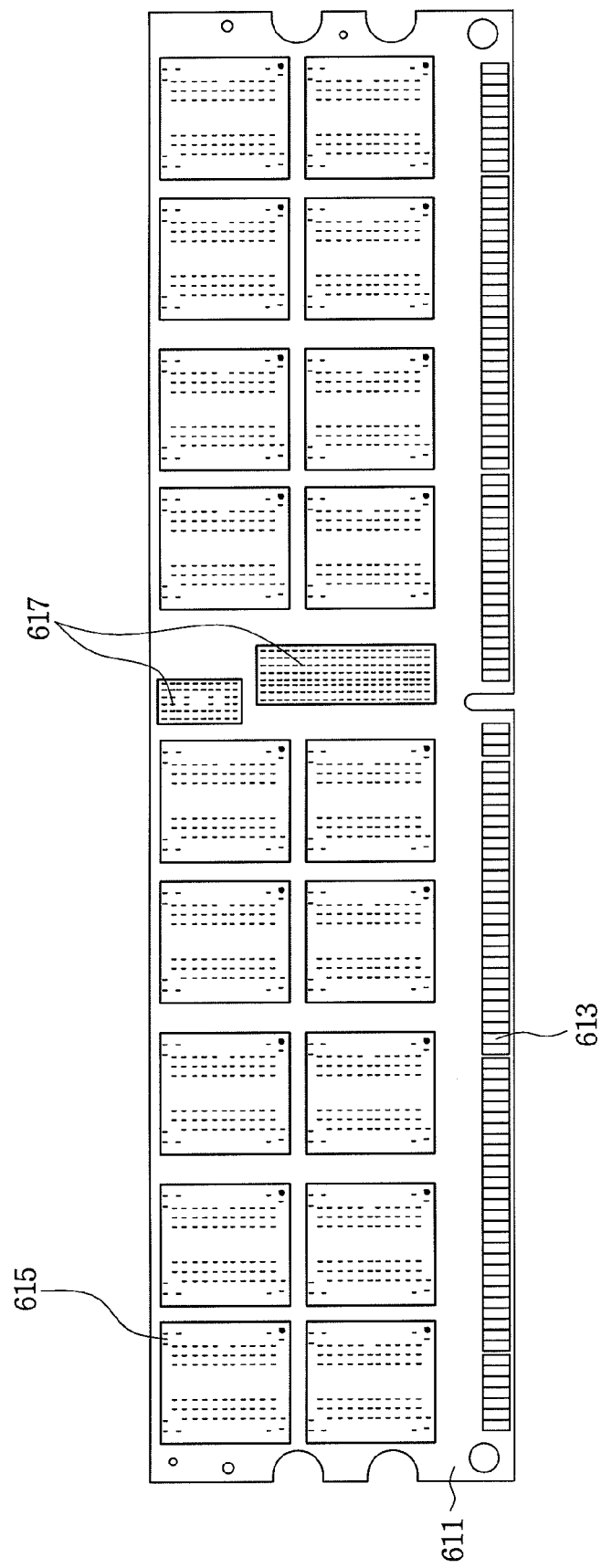
FIG. 13 is a schematic diagram of a semiconductor module, in which a stack-type semiconductor package is mounted, according to an exemplary embodiment of the present invention.

FIG. 13 is a schematic diagram of a semiconductor module, in which a stack-type semiconductor package is mounted, according to an exemplary embodiment of the present invention.

Referring to FIG. 13, the semiconductor module includes a substrate body 611 including a plurality of tabs 613 and stack-type semiconductor packages 615 mounted on the substrate body 611. The stack-type semiconductor package 615 may include stack-type semiconductor packages lo according to exemplary embodiments of the present invention. Discrete devices 617 may be mounted on the substrate body 611. The discrete devices 617 may include one of a register, a capacitor, an inductor, a resistor, a programmable device, or a non-volatile memory device. The semiconductor module may be adapted as a data storage device of a plurality of electric systems such as, for example, personal computers, system servers, or communication devices. The semiconductor module may be electrically connected to an external connector through the tabs 613 mounted on the substrate body 611.

According to an exemplary embodiment of the present invention, an upper semiconductor package having an upper chip structure projecting from an upper substrate may be combined with a lower semiconductor package including a lower molding layer having a recessed region in its upper surface to form a stack-type semiconductor package. The upper chip structure of the upper semiconductor package may be disposed in the recessed region of the lower semiconductor package to reduce the thickness of the stack-type semiconductor package as a whole. Therefore, the size of an electronic device adapting the stack-type semiconductor package can be reduced.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. An electronic device, comprising:
a lower electronic part including a lower substrate, a lower chip structure disposed on the lower substrate, and a lower molding layer covering the lower chip structure and having a recessed region in an upper surface of the lower molding layer; and
an upper electronic part including an upper substrate disposed on the lower electronic part, and an upper chip structure projecting from the upper substrate, wherein the recessed region of the lower molding layer receives the upper chip structure, wherein a top surface of the upper substrate closes a top of the recessed region, and an upper molding layer extends from the top surface of the upper substrate to a bottom surface of the recessed region.

2. The electronic device of claim 1, wherein the lower substrate is a printed circuit board, and the lower chip structure includes a semiconductor chip connected to the lower substrate in a wire bonding structure or in a flip-chip structure.

3. The electronic device of claim 1, wherein the upper substrate is a printed circuit board, and the upper chip structure includes a semiconductor chip connected to the upper substrate in a wire bonding structure or in a flip-chip structure.

4. The electronic device of claim 3, wherein the upper molding layer comprises an insulating protection layer covering the upper chip structure and disposed in the recessed region.

5. The electronic device of claim 1,
wherein the upper substrate is a printed circuit board having an opening, and the upper chip structure includes:
an upper chip contacting the upper substrate around the opening; and
wires electrically connecting the upper chip exposed by the opening to the upper substrate, wherein each of the wires has a first end contacting the upper chip exposed by the opening and a second end contacting the upper substrate adjacent to the opening through the opening.

6. The electronic device of claim 5, further comprising a protection layer filling the opening of the upper substrate, covering the wires, and projecting from a surface opposite to forming a surface of the upper substrate contacting the upper chip.

7. The electronic device of claim 6, further comprising:
a first substrate disposed on the upper substrate;
a first molding layer interposed between the first substrate and the upper substrate and having a first recessed region surrounding a sidewall of the protection layer projecting from the upper substrate, wherein a depth of the first recessed region is the same as a height of the protection layer projecting from the upper substrate; and
a first chip structure electrically connected to the first substrate and disposed in the first molding layer.

8. The electronic device of claim 1, further comprising a connection structure disposed at both sides of the lower and upper chip structures, and contacting the lower substrate and the upper substrate to electrically connect the lower electronic part to the upper electronic part.

9. The electronic device of claim 8, wherein the connection structure includes a single ball structure, a multiple ball structure, a spacer structure or a through electrode structure.

10. The electronic device of claim 9, wherein the connection structure includes the multiple ball structure comprising at least two balls stacked on each other.

11. The electronic device of claim 1, further comprising a semiconductor package provided on the upper electronic part, wherein the semiconductor package is a single chip semiconductor package or a multi chip semiconductor package.

12. The electronic device of claim 1, further comprising a ball structure disposed opposite to the lower chip structure with the lower substrate interposed therebetween.

13. The electronic device of claim 1, further comprising:
a processor for performing data communication with a first electronic part including the lower electronic part and the upper electronic part; and
an input/output unit for performing data communication with the processor.

14. The electronic device of claim 13, further comprising a board mounting the processor and the first electronic part thereon.

15. The electronic device of claim 1, further comprising a substrate body mounting the first electronic part including the lower electronic part and the upper electronic part thereon, wherein the substrate body includes a plurality of tabs.

16. The electronic device of claim 15, further comprising discrete devices disposed on the substrate body, wherein each of the discrete devices is spaced apart from the first electronic part.

17. The electronic device of claim 1, wherein the upper chip structure includes a semiconductor chip, and a top surface of the semiconductor chip contacts the bottom surface of the recessed region.

18. An electronic device, comprising:
a lower electronic part including a lower printed circuit board, a lower chip structure disposed on the lower printed circuit board, and a lower molding layer covering the lower chip structure and having a recessed region in an upper surface of the lower molding layer;
an upper electronic part including an upper printed circuit board disposed on the lower electronic part, and an upper chip structure projecting from the upper printed circuit board; and
first and second connection structures disposed at both sides of the lower and upper chip structures, and contacting the lower printed circuit board and the upper printed circuit board to electrically connect the lower electronic part to the upper electronic part,
wherein the upper chip structure includes an upper semiconductor chip electrically connected to the upper printed circuit board,
wherein the lower chip structure includes a lower semiconductor chip electrically connected to the lower printed circuit board,
wherein at least a portion of the upper semiconductor chip is disposed in the recessed region of the lower molding layer.

19. The electronic device of claim 18, wherein a width of the lower semiconductor chip is greater than a width of the upper semiconductor chip.

20. The electronic device of claim 18, wherein the upper semiconductor chip is disposed to partially fill the recessed region.

* * * * *